United States Patent
Deeney

Patent Number: 5,521,425
Date of Patent: May 28, 1996

[54] TAPE AUTOMATED BONDED (TAB) CIRCUIT

[75] Inventor: Jeffrey L. Deeney, Fort Collins, Colo.

[73] Assignee: Hewlett-Packard Company, Palo Alto, Calif.

[21] Appl. No.: 633,591

[22] Filed: Dec. 21, 1990

[51] Int. Cl.$^6$ .......... H01L 23/48; H01L 23/52; H01L 29/40; H01L 23/28

[52] U.S. Cl. .......... 257/666; 257/690; 257/692; 257/734; 257/735; 257/787

[58] Field of Search .......... 357/80, 72

[56] References Cited

U.S. PATENT DOCUMENTS

| | | | |
|---|---|---|---|
| 3,484,534 | 12/1969 | Kilby et al. | 357/80 |
| 4,138,691 | 2/1979 | Bonkohara et al. | 357/80 |
| 4,151,543 | 4/1979 | Hayakawa et al. | 357/80 |
| 4,280,132 | 7/1981 | Hayakawa et al. | 357/80 |
| 4,300,153 | 11/1981 | Hayakawa et al. | 357/80 |
| 4,842,662 | 6/1989 | Jacobi . | |
| 4,850,105 | 7/1989 | Nakajima et al. | 357/80 |
| 4,944,850 | 7/1990 | Dion . | |
| 5,016,084 | 5/1991 | Nakao | 357/72 |

*Primary Examiner*—Sara W. Crane
*Assistant Examiner*—Carl Whitehead, Jr.

[57] ABSTRACT

A tape automated bonded circuit comprising a flexible substrate having an opening defined by a peripheral sidewall. A plurality of conductive traces are provided on the flexible substrate which terminate in a plurality of leads which extend into alignment with the opening. An electronic device having a plurality of pad regions is aligned with the opening in the substrate. The leads are bonded to the pad regions. A continuous encapsulation layer which touches the peripheral side wall of the substrate opening on all sides encapsulatingly covers the bonded leads and pad regions and structurally reinforces each lead along the entire length which projects over the opening.

4 Claims, 1 Drawing Sheet

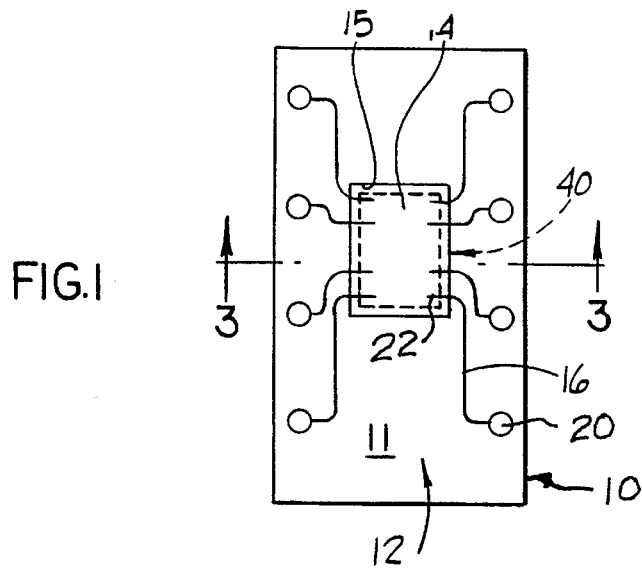
FIG.1
FIG 2
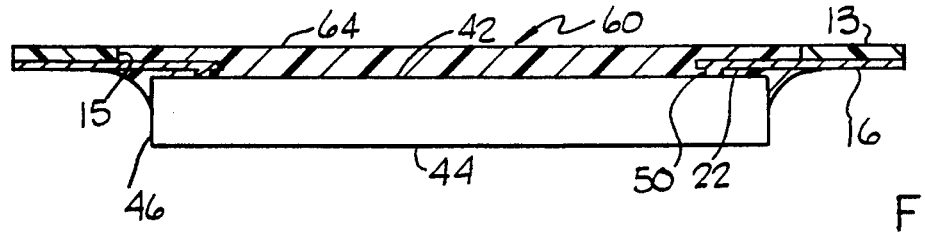
FIG 3
FIG.4

TAPE AUTOMATED BONDED (TAB) CIRCUIT

BACKGROUND OF THE INVENTION

The present invention generally relates to tape automated bonded (TAB) circuits, and more particularly to a TAB circuit which comprise an encapsulation layer applied over lead/pad bonding regions of the circuit.

The rapid development of new and advanced microelectronic devices has created a corresponding need for improved circuit mounting structures. One type of circuit mounting structure currently in use is called a tape automated bonded circuit, commonly known as a "TAB" circuit.

TAB circuits were first researched and developed in the mid-1960's. As discussed in Rima, P. W., "The Basics of Tape Automated Bonding," *Hybrid Circuit Technology*, November 1984, pp. 15–21, a TAB circuit is constructed using a thin film carrier tape which is typically stored on large reels. The tape has a variable width of between 8 and 70 mm, and is approximately 5 mils thick. The length of each portion of tape used to form an individual circuit package is selectively variable, depending on the type of circuit to be made. The tape may be manufactured from a variety of different dielectric materials, including polyimide, and/or epoxy-glass compositions. Polyimide is generally preferred in that it has a high degree of mechanical strength, is capable of withstanding relatively high temperatures, and has a high coefficient of linear expansion similar to that of copper. It also has a relatively low coefficient of moisture absorption (about 3%).

There are numerous methods which may be used to construct TAB circuits. See, for example, U.S. Pat. No. 4,944,850 of John H. Dion et al., which is hereby specifically incorporated by reference for all that it discloses. One method (known as the "three layer process") involves the use of a thin, conductive foil typically manufactured of copper or copper alloy which is bonded to the tape using an adhesive known in the art. The foil is approximately 1.4 mils thick in a typical embodiment. In addition, an opening or window is physically formed through the center of each portion or "frame" of tape by chemical etching or other conventional means, including the use of a punch and die assembly. The foil is then etched to produce a conductive printed circuit pattern having beam-type inner leads which extend into the window.

In an alternative construction method commonly known as the "two layer process", a base layer of metal (e.g., copper) is directly sputtered or otherwise deposited onto the tape. Next, the tape substrate is run through an electroless bath of metal (e.g., copper) which deposits a very thin layer of metal onto the substrate surface and first metal layer. After window formation as described above, the top layer of metal is covered with a thin layer of photoresist which is imaged and developed, leaving a exposed metal pattern. The patterned substrate is passed through an electrolytic bath where a further metal layer is plated onto the exposed metal pattern. Resist materials are applied and subsequently etched to produce the completed product, as discussed in Dixon, T., "TAB Technology Tackles High Density Interconnections", *Electronic Packaging and Production*, pp. 34–39 (December, 1984).

As noted above, the metal used to create the circuit patterns normally involves copper or a copper alloy. These materials have a tendency to corrode which may adversely affect the operational capabilities of the circuit. To prevent surface corrosion, the circuit pattern is normally plated with a non-corrosive metal (e.g., gold, palladium, and/or rhodium.) Typically, the non-corrosive metal is electroplated onto the circuit pattern. Electroplating is a conventional process, which is normally accomplished by immersion of the circuit into a bath of metal solution, followed by the application of a current to the circuit. Simultaneously with the application of current to the circuit, a current of opposite charge is applied to the metal solution. As a result, metal from the solution is plated onto the circuit. So that electrical current may be applied to the circuit as described above, all of the circuit traces must be shorted together to ensure complete plating.

After plating, a selected electronic device, e.g. an integrated circuit chip (IC), is positioned within the window and secured therein by bonding the inner leads of the circuit to contact regions on the device.

Historically prior to inner lead bonding, the IC contact or "pad" regions, which are typically aluminum, would have gold bumps plated thereto. The bumping process involves multiple operations in addition to the standard wafer manufacturing process, increasing the risk of damage to the IC. The bumping process is also a relatively expensive process. In a more recently developed TAB manufacturing process, the gold plated TAB leads are bounded directly to the aluminum bonding pads of the IC, eliminating the need for pad bumping. One manner for achieving such direct lead/pad bonding is through one of a single point thermosonic bonding process which may be performed, for example, with a Hughes Model 2460-2 Thermosonic Single Point. Bender which is commercially available from Hughes Aircraft having a business address of 2051 Palomar Airport Road, Carlsbad, Calif., 92009.

When the pad bumping process is employed for achieving lead/pad bonding, the pad region of the IC is completely covered by the bump, protecting it from environmental degradation. The direct lead/pad bonding technique is generally preferable to bump bonding from a production cost standpoint. However, a problem with the direct lead/pad bonding technique is that it leaves the aluminum pad regions of the connected IC exposed. This shortcoming has been overcome by coating the side of the IC containing the pad regions with a dielectric encapsulation material which seals the aluminum bonding pads from environmental hazards.

Encapsulation material is generally chosen to match the coefficient of thermal expansion of the IC. An ideal encapsulation material provides protection from moisture and corrosive environments that the circuit may encounter. It also is low in alpha particle emissions, acts as a suitable alpha particle barrier, and has flow properties conducive to automated dispensing. Common encapsulating materials include silicone gels, thermoset epoxies, and polyimide-based coatings.

The encapsulating material is typically dispensed from a dispensing needle. The needle is positioned above the IC and is moved in an outwardly spiralling motion as the encapsulating material is dispensed. The encapsulating material is typically applied so as to cover the pad side of the IC. The encapsulation layer terminates near the edge of the pad side of the IC in spaced apart relationship with the periphery of the opening in the flexible substrate.

This encapsulation technique thus leaves the portion of each of the leads which is positioned over the opening in the flexible substrate exposed to the environment. However, since the leads, like the remainder of the traces, are coated with gold, this would not appear to be a problem.

SUMMARY OF THE INVENTION

It is applicant's discovery that the inner leads of TAB circuits are subject to mechanical failure which may result in performance degradation of the TAB circuit. Applicant has also discovered that the probability of lead failure in TAB circuits may be reduced by providing the TAB circuit with an encapsulation layer which extends across the pad containing surface of the connected IC and into touching relationship with the sidewall of the opening in the flexible substrate. The encapsulation layer when thus applied completely covers and reinforces the leads in the portions thereof which extend into alignment with (i.e. which extend over/under) the substrate opening.

Thus, the invention may comprise a method of manufacturing a tape automated bonded circuit including the steps of: (a) providing a flexible substrate having an opening therethrough defined by a peripheral sidewall and having a plurality of conductive traces provided thereon which terminate in a plurality of leads which extend into alignment with the opening; (b) providing an electronic device having a plurality of pad regions thereon; (c) positioning the electronic device in alignment with the opening in the substrate; (d) bondingly connecting the leads to the pad regions; and (e) covering the bondingly connected leads and pad regions with a continuous layer of encapsulation material which touches the peripheral sidewall of the substrate opening.

The invention may also comprise a tape automated bonded circuit comprising a flexible substrate having an opening therethrough defined by a peripheral sidewall. A plurality of conductive traces are provided on the flexible substrate which terminate in a plurality of leads which extend into alignment with the opening. An electronic device having a plurality of pad regions thereon is aligned with the opening in the substrate. The leads on the substrate are bonded to the pad regions on the electronic device. A continuous encapsulation layer which touches the peripheral side wall of the substrate opening on all sides encapsulatingly covers the bonded leads and pad regions and structurally reinforces each lead along the entire length thereof which projects over the opening.

BRIEF DESCRIPTION OF THE DRAWINGS

An illustrative and presently preferred embodiment of the invention is shown in the accompanying drawings in which:

FIG. 1 is a bottom plan view of a portion of a tape automated bonded (TAB) circuit prior to connection with an IC device.

FIG. 2 is a top plan view of a portion of a TAB circuit subsequent to connection with an IC device.

FIG. 3 is a detail cross-sectional elevation view of a portion of a TAB circuit prior to application of encapsulation material thereto.

FIG. 4 is a detail cross-sectional elevation view of a portion of a TAB circuit subsequent to application of encapsulation material thereto..

DETAILED DESCRIPTION OF A PREFERRED EMBODIMENT

With reference to FIGS. 1 and 2, a TAB circuit 10 is illustrated. The circuit 10 includes a tape substrate 12 having a first flat face surface 11, FIG. 1, and a second flat face surface 13, FIG. 2. The substrate 12 is preferably manufactured of polyester, polyimide, or epoxy-glass compositions. The tape substrate 12 includes a window 14 therethrough of selectively variable size which is defined by a rectangular sidewall 15. The window 14 is sized to be slightly larger than an integrated circuit (IC) or other electronic device 40 which is positioned in alignment with the window as shown in phantom.

The tape substrate 12 also includes at least one conductive metal layer in the form of a trace pattern 16 which interfaces with the first face surface 11 thereof. The trace pattern 16 is typically formed through the attachment of a thin conductive metal foil to the substrate 12 (e.g., 1.4 mil thick copper) using an adhesive known in the art. The foil is then etched using conventional techniques to produce the trace pattern 16. Formation of the trace pattern is described in greater detail in Rima, P. W., "The Basic of Tape Automated Bonding," *Hybrid Circuit Technology*, November, 1984, pp 15–21. However, there are alternative ways to produce the trace pattern 16 as noted above.

With continued reference to FIGS. 1 and 2, the trace pattern 16 includes a selectively variable quantity of conductive pads 20, each pad 20 being conductively connected to a lead 22. The pads 20 communicate with leads 22 through individual traces which comprise the trace pattern 16. As shown in FIG. 1, the leads 22 extend outwardly into alignment with the window 14, i.e. extends into a three-dimensional region formed by projecting the window opening 14 normal to surface 11. As discussed herein, this positioning of the lead may alternatively be referred to as projecting or extending "over" the window. In a preferred embodiment, each lead 22 is approximately 0.002 inch wide and extends out over the window 14 by about 0.038 inch, although these values may be varied as desired. The leads 22 are adapted for subsequent attachment to an IC or other comparable electronic device 40.

Since the leads 22 and trace pattern 16 are normally manufactured of copper (or other metal subject to corrosion), a protective coating of substantially inert metal (e.g., gold) is traditionally applied thereto. This is formally accomplished by electroplating processes known in the art which basically involve immersing the trace pattern 16 in a selected metal solution, applying a current to the pattern, and applying a current of opposite charge to the solution. This results in the plating of metal from the solution onto the trace pattern 16. As indicated above, electroplating is a conventional process. The actual electrical currents used and metal solutions involved may be selectively varied in accordance with numerous factors, including the size of the circuit, the materials used to form the circuit, the desired application for which the circuit is intended, etc. Basic techniques for electroplating which are applicable to the present invention are described in *Metal Finishing*, Michael Murphy—editor, Metals and Plastics Publications, Hackensack, N.J., Vol. 83, No. 1A (January, 1985); and Lowenheim, F. A., *Electroplating: Fundamentals of Surface Finishing*, McGraw-Hill, Inc., 1978.

To accomplish electroplating of the trace pattern 16, all of the individual traces must be shorted together so that current may flow therethrough.

Techniques for shorting the traces for electroplating are described in above-referenced U.S. Pat. No. 4,944,850.

After electroplating, the traces are tested for shorts and opens. Such testing techniques are also described in U.S. Pat. No. 4,944,850.

As shown by FIGS. 2–4, electronic device 40 may comprise a flat, rectangularly shaped member having a first generally flat face surface 42 and an opposite flat face surface 44 connected by a sidewall 46. A plurality of exposed contact pads 50 are provided about the periphery of the first face surface 42.

The electronic device 40 is positioned in alignment with window 14 immediately below substrate surface 11 such that each pad 50 on device 40 is positioned in registration with a corresponding lead 22 of trace pattern 16.

The trace leads 22 are fixedly conductively bonded to the pads 50 as by single point thermosonic bond 52 such as described in U.S. Pat. No. 4,842,662 of John W. Jacobi, which is hereby specifically incorporated by reference for all that is disclosed therein, or by using other bonding techniques.

After lead/pad bonding, a layer of encapsulation material 60 is applied to the first face surface 42 of the electronic device 40 as by an extrusion needle 60. The needle is typically moved in a spiralling motion above surface 40 as encapsulation material is dispensed therefrom at a controlled rate. One assembly for applying encapsulation material in this manner is sold under the product designation Asymtek Model 403 and is commercially available from Asymtek having a business address of 1949 Palomar Oaks Way, Carlsbad, Calif., 92009-1307. The encapsulation material used may be any of a number of different materials, including silicones, polyimides, and filled epoxies, and is preferably a synthetic silica filled epoxy such as that manufactured by Hokuriku Toryo Company, Ltd. of Japan, under the product designation Hokuriku Chipcoat 8101, which is commercially available from Pacific Polytech, Inc., 15 Commercial Blvd., Novato, Calif., 94949.

The chip 40 or dispense needle 62 may be heated during the dispense operation to obtain the desired rheology to obtain uniform coatings that completely cover the surface 42 and interconnections. However, it is generally desirable to avoid heating unless absolutely necessary.

Following dispense of encapsulation material, the coating must complete a cure process which could be initiated by means of UV radiation, microwave energy, or most preferably, elevated temperature. The elevated temperature can be applied by means of conduction heating, IR radiant heating, or convective heating, the preferable method being convective heating in an oven environment.

The temperature profile used to cure the encapsulant will be dependent on the encapsulation material. If solvents are present in the dispensed coating, a slow temperature ramp must be used to prevent the formation of voids that can adversely impact device reliability. When using solventless systems, a fast temperature ramp is often performed immediately following the dispense process to solidify, or "gel", the encapsulation material, making the device less susceptible to handling damage during the cure process. This is particularly useful in reel-to-reel TAB processes.

The maximum cure temperature must be sufficient to fully cross-link the polymer coating. Typical cure cycles involve exposure to temperatures ranging from 130°–200° C. for 30 minutes to 2 hours to obtain full cure.

In applying a synthetic silica filled phenol epoxy, the application needle 62 and IC 40 are maintained at room temperature during the application process. Curing may take place in a convection oven using a ramped cure. The tab circuit 10 including encapsulation material 60 is initially heated in the oven at 80° C. for approximately one hour. Then, the oven is ramped up to 150° C. over a period of one-half hour and is thereafter held at 150° C. for approximately one hour to complete the heat cure.

According to the present invention, the encapsulation material is applied in a manner and in sufficient quantity such that it completely covers the first face surface 42 of the device 40 and such that it extends into interfacing relationship with the entire peripheral sidewall 15 defining substrate opening 14 and a substantial portion, e.g. 50%, of the sidewall 46 of IC 40 and is itself supported at its interface with substrate opening sidewall 15 and IC sidewall 46. The encapsulation material 60 thus completely covers all portions of the leads 22 which extend out over window 14. In one preferred embodiment, the encapsulation material is applied in a manner such that after curing it is provided with an exposed flat surface portion 64 which is approximately coplanar with second face surface 13 of flexible substrate 12. The encapsulation layer thus applied serves to structurally reinforce the leads 22 along the entire length of their otherwise unsupported extension over opening 14.

Applicants have discovered that the structural support to the leads 22 which is provided by encapsulation material 60 reduces the probability of lead failure and consequent degradation of circuit performance.

While an illustrative and presently preferred embodiment of the invention has been described in detail herein, it is to be understood that the inventive concepts may be otherwise variously embodied and employed and that the appended claims are intended to be construed to include such variations except insofar as limited by the prior art.

What is claimed is:

1. A tape automated bonded circuit comprising:

a flexible substrate having an opening therethrough defined by a peripheral sidewall;

a plurality of conductive traces provided on said flexible substrate which terminate in a plurality of leads which extend into alignment with said opening;

an electronic device having a plurality of pad regions thereon aligned with said opening in said substrate;

bonding means for connecting said leads to said pad regions;

continuous encapsulation means touching said peripheral side wall of said substrate opening for encapsulatingly covering said bondingly connected leads and pad regions and for structurally reinforcing said leads from said peripheral sidewall of said opening to said bonding means;

wherein said electronic device comprises a first face, a second face and a peripheral sidewall extending between said first face and said second face, said plurality of pad regions being provided on said first face;

wherein said continuous encapsulation means covers the entire first face of said electronic device and at least a portion of said peripheral sidewall of said electronic device and wherein said second face of said electronic device is exposed;

wherein said substrate comprises a first flat face which interfaces with said traces and a second flat face positioned opposite to said first face thereof; and wherein said electronic device is positioned outside of said opening in said substrate with said first face of said substrate positioned proximal said first face of said electronic device and said second face of said substrate positioned distal said first face of said electronic device.

2. The invention of claim 1 wherein said opening in said substrate is entirely filled by said continuous encapsulation means and wherein said continuous encapsulation means comprises a flat surface extending in substantially coplanar relationship with said second flat face of said substrate.

3. The invention of claim 2 wherein said encapsulation means comprises filled epoxy.

4. The invention of claim 2 wherein said encapsulation means is positioned entirely between a first plane defined by said second flat surface of said substrate and a second plane defined by said second face of said electronic device.

\* \* \* \* \*